United States Patent (10) Patent No.: US 6,649,427 B2
Koveshnikov et al. (45) Date of Patent: Nov. 18, 2003

(54) METHOD FOR EVALUATING IMPURITY CONCENTRATIONS IN EPITAXIAL SUSCEPTORS

(75) Inventors: Sergei V. Koveshnikov, Vancouver, WA (US); Douglas G. Anderson, Vancouver, WA (US)

(73) Assignee: SEH America, Inc., Vancouver, WA (US)

(*) Notice: Subject to any disclaimer, the term of this patent is extended or adjusted under 35 U.S.C. 154(b) by 156 days.

(21) Appl. No.: 10/003,960

(22) Filed: Nov. 14, 2001

(65) Prior Publication Data

US 2002/0052095 A1 May 2, 2002

Related U.S. Application Data

(63) Continuation-in-part of application No. 09/544,197, filed on Apr. 6, 2000.

(51) Int. Cl.[7] .............................................. H01L 21/66
(52) U.S. Cl. ........................ 438/14; 438/16; 438/471; 438/476; 438/FOR 142
(58) Field of Search ........................... 438/14, 16, 471, 438/476, FOR 142

(56) References Cited

U.S. PATENT DOCUMENTS 5,233,191 A  8/1993  Noguchi et al.
6,174,740 B1  1/2001  Ohta et al.

FOREIGN PATENT DOCUMENTS

JP   06-177222 A   *  6/1994   ........... H01L/21/66
JP   08-340008 A   *  12/1996  ........... H01L/21/324
JP   10-223713 A   *  8/1998   ........... H01L/21/66

* cited by examiner

*Primary Examiner*—Amir Zarabian
*Assistant Examiner*—Christy Novacek
(74) *Attorney, Agent, or Firm*—Douglas G. Anderson

(57) ABSTRACT

A method for non-destructively evaluating the concentration of impurities in an epitaxial susceptor used in the processing of a semiconductor substrate. The method includes processing a semiconductor substrate of known impurity levels on the epitaxial susceptor, and measuring the impurity levels after epitaxial processing by drawing together at least a portion of the impurities and measuring the concentration of impurities that were drawn together. In one embodiment of the invention, a gettering layer is formed adjacent one or more surfaces of the substrate to getter impurities from the substrate into the gettering layer. The impurity concentration of the gettering layer is then measured and the results are used to determine at least a range of impurity concentrations that were transferred to the substrate from the epitaxial susceptor.

5 Claims, 3 Drawing Sheets

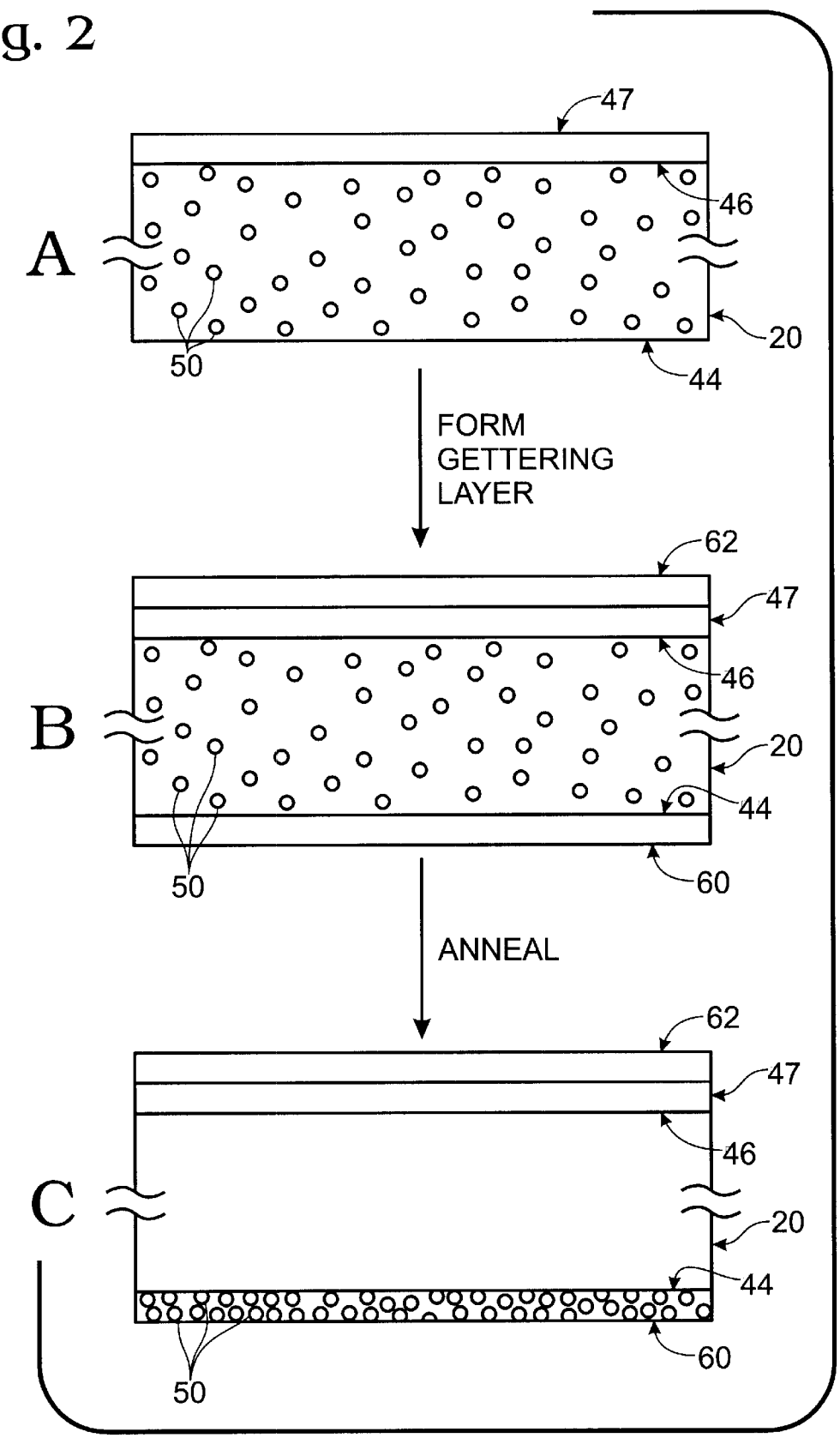

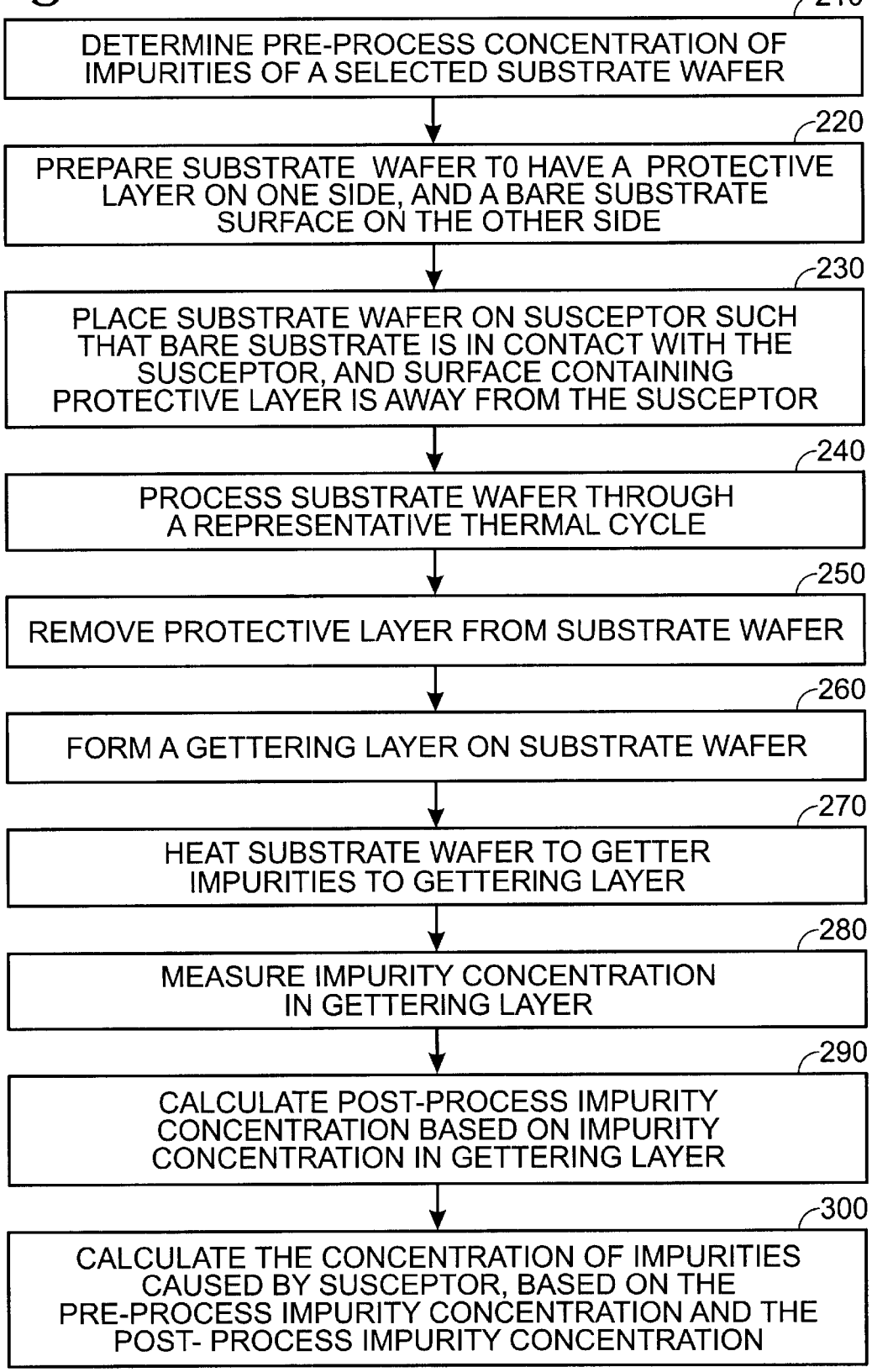

METHOD FOR EVALUATING IMPURITY CONCENTRATIONS IN EPITAXIAL SUSCEPTORS

REFERENCE TO RELATED APPLICATIONS

The present application is a continuation-in-part of U.S. application Ser. No. 09/544,197 filed Apr. 6, 2000, the contents of which are hereby incorporated by reference in their entirety.

TECHNICAL FIELD

The present invention relates to semiconductor processing, and more particularly to measuring impurity concentrations in susceptors used to secure wafers in epitaxial reactors.

BACKGROUND OF THE INVENTION

Manufacturers of semiconductor integrated circuits are constantly striving to increase the performance and reduce the price of their products. One way to both increase the performance and reduce the price of an integrated circuit is to reduce the size of the integrated circuit. By reducing the size of a circuit, more circuits can be manufactured on a single semiconductor substrate, thereby reducing the unit cost of the circuit. In addition, reducing the size of a circuit typically increases its speed and reduces its power consumption.

One problem manufacturers encounter in attempting to reduce the size of their integrated circuits involves impurity contamination. For example, metallic contamination of a semiconductor substrate can cause excess leakage currents, poor voltage breakdown characteristics, and reduced minority carrier lifetimes. As the size of an integrated circuit decreases, the detrimental effect of impurities in the semiconductor is magnified. For extremely small circuits, even relatively low levels of contamination can be sufficient to render the circuit inoperative. Therefore, manufacturers take extraordinary measures to prevent impurity contamination in their manufacturing processes.

To optimize their contamination control practices, manufacturers often need to measure the concentration of impurities in their semiconductor substrates at various points during the manufacturing process. This allows manufacturers to determine which area(s) of their process are causing impurity contamination problems. However, as the levels of impurity concentration have decreased to very low levels, it has become more and more difficult to measure the impurity concentration. Indeed, semiconductor industry standards such as the National Semiconductor Roadmap call for impurity concentrations to be as low as $10^{10}$ cm$^{-3}$ in the near future. Since the atomic density of a typical semiconductor substrate such as silicon is approximately $10^{22}$ cm$^{-3}$, impurity concentrations of $10^{10}$ cm$^{-3}$ can be very difficult to measure even with sophisticated measurement equipment.

For example, copper (Cu) and nickel (Ni) are two metallic impurities found in semiconductor substrates. Impurity concentrations of copper and nickel in heavily boron-doped substrates typically are measured by techniques such as Total Reflection X-Ray Fluorescence (TXRF) and Secondary Ion Mass Spectroscopy (SIMS), etc. The minimum detection limit of copper is approximately $10^{17}$ cm$^{-3}$ by TXRF (measured near the surface of the substrate) and approximately $10^{15}$ cm$^{-3}$ by SIMS. As a result, manufacturers have begun to search for new ways to measure impurity concentrations in semiconductor substrates.

As acceptable levels of metallic impurities are continually being reduced and new methods for measuring impurity concentrations are developed, manufacturers must understand and control the impurity concentrations of equipment used to manufacture semiconductor substrates, and in particular equipment that comes in physical contact with the semiconductor substrate.

One such apparatus of concern is the susceptor used in epitaxial deposition. During epitaxial deposition, the entire backside of the semiconductor substrate is in contact with the susceptor. Since the epitaxial deposition step is performed at relatively high temperatures of approximately 1000° C. or higher, any contaminants contained within the susceptor can migrate into the semiconductor wafer, which is very undesirable. It is therefore very important to use equipment that physically contacts the substrate wafer, such as a susceptor, that also has low concentrations of impurities. Unfortunately, reliable methods to determine the concentration of metallic impurities in this type of equipment are destructive. These destructive methods are undesirable because they prevent the ability to ensure that a part is fit for use because the susceptor must be destroyed to obtain the needed results.

The current method to protect from contamination migration is to put a protective layer, such as an oxide layer, on the back of the semiconductor substrate. This, however, is a very expensive process step, and does not add any value to the substrate other than protection. This oxide layer could be eliminated without risk of contamination if a method of determining the impurity concentration level of a susceptor could be achieved. As such, there is a need to be able to non-destructively determine the contamination levels of a susceptor.

SUMMARY OF THE INVENTION

The invention provides a method for evaluating the concentration of impurities in an epitaxial susceptor by measuring the concentrations of impurities of a semiconductor wafer that contacts the susceptor. The method includes running an epitaxial cycle with a monitor wafer having contamination levels below detection limits placed on the susceptor and running an epitaxial deposition cycle. At least a portion of the contaminants which have migrated from the susceptor to the monitor wafer are drawn together and measured. In one embodiment of the invention, a gettering layer is formed on the surface of the wafer that was in contact with the susceptor to getter impurities that have migrated from the susceptor. The impurity concentration of the gettering layer is then measured and the resulted are used to determine at least a range of impurity concentrations that were in the susceptor prior to the epitaxial deposition cycle.

BRIEF DESCRIPTION OF THE DRAWINGS

The invention will be described in relation to the following drawings in which like reference numerals refer to like elements, and wherein:

FIG. 2 is a schematic flowchart diagram showing cross-sectional views of a semiconductor substrate that has been processed on an epitaxial reactor, the diagram illustrates a method according to the present invention for drawing together impurities transferred from the susceptor into the semiconductor substrate to a gettering layer formed on the substrate;

FIG. 3 is a flowchart illustrating a method of evaluating the concentration of impurities in a susceptor according to the present invention.

DETAILED DESCRIPTION OF THE INVENTION

Figure 1:
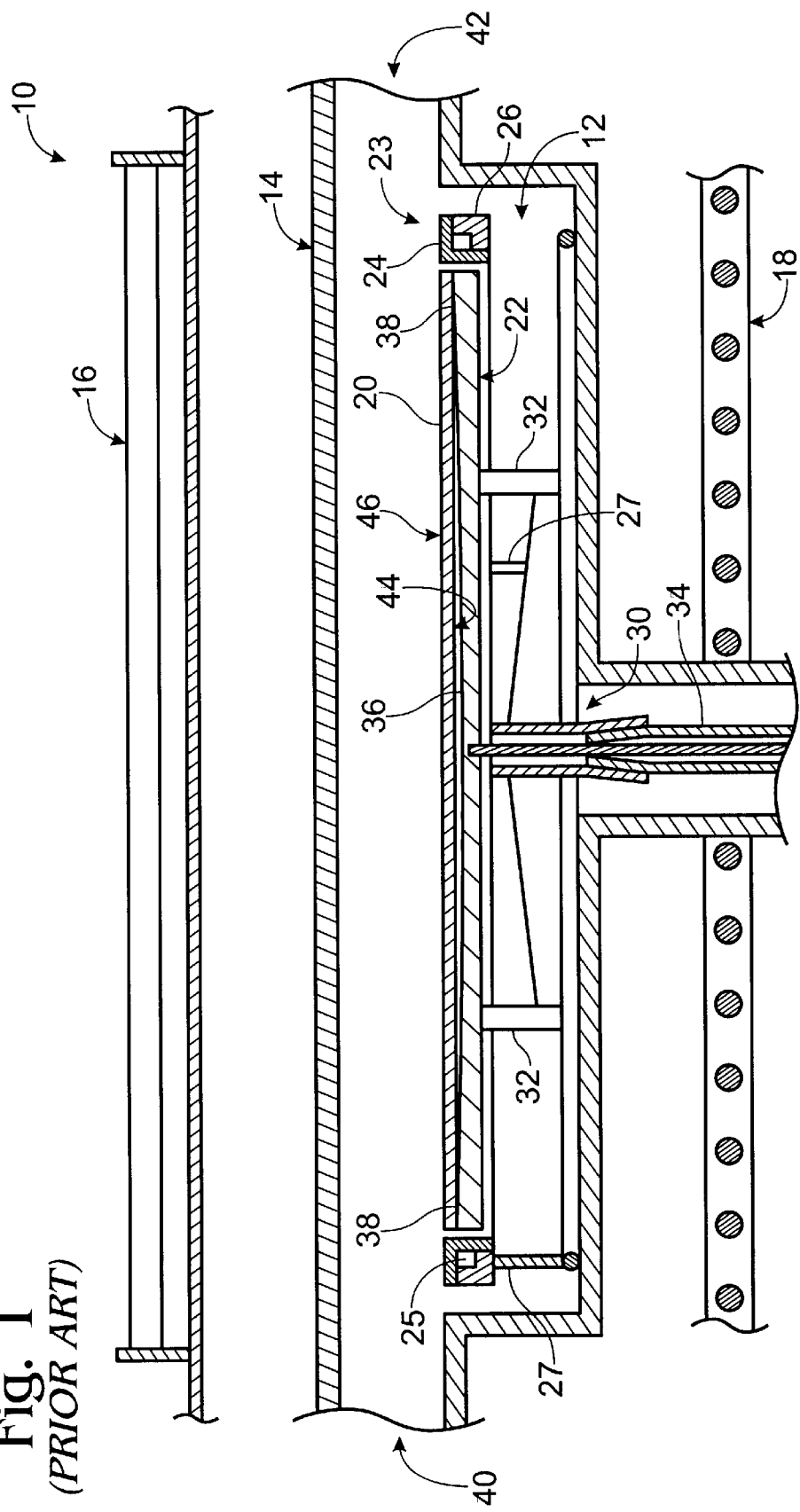
FIG. 1 is a cross-sectional view of an epitaxial reactor including a susceptor.

Referring now to FIG. 1, an epitaxial reactor is shown generally at 10, including a susceptor assembly shown at 12. The reactor 10 includes a reaction chamber 14 flanked on an upper side by an upper heat lamp array 16 and on a lower side by a lower heat lamp array 18. Susceptor assembly 12 is positioned within reaction chamber 10, and is configured to support semiconductor wafer 20 within reaction chamber 14.

As shown in FIG. 1, susceptor assembly 12 includes several components, each of which are heated by the upper and lower heat lamp arrays 16 and 18 as the reaction chamber 14 is heated to a process temperature. Susceptor assembly 12 includes a susceptor 22, typically of graphite construction, which acts to absorb heat energy from lamps 16 and 18, and to evenly distribute the heat energy to wafer 20 during epitaxial deposition. Susceptor 22 typically includes a depression 36 on its top surface. During epitaxial growth, wafer 20 rests upon the susceptor 22, contacting it only at the peripheral edge 38. As shown in FIG. 1, susceptor 22 rests directly upon posts 32 of tripod 30. Tripod 30 rests upon shaft 34, which is configured to rotate under the influence of a motor (not shown).

In standard epitaxial operation, the reaction chamber is heated to a process temperature and a source gas containing semiconductor constituents is flowed from inlet 40 to outlet 42, across a front side 46 of wafer 20 on its way through the reaction chamber. Typically, the semiconductor constituents are adsorbed onto the wafer surface at high temperature and diffuse across the surface to form the epitaxial layer. In the present invention, however, the purpose is not necessarily to form an epitaxial layer, but rather to simulate the formation steps such that impurities found within the susceptor 22 can migrate into the wafer 20. As such, the front side 46 of wafer 20 contains a protective layer (not shown), such as an oxide layer, to protect the wafer from any impurities that may be found in the source gas. In addition, susceptor 22 inhibits epitaxial growth on the backside 44 of the wafer 20 by mechanically inhibiting gas flow to the backside of the wafer. The backside 44 of the wafer 20 is in full contact with the susceptor 22. Therefore, any impurities within the susceptor 22 can migrate to the backside 44 of the wafer during the thermal cycle of epitaxial deposition.

In reactors such as 10, the susceptor 22 is used to distribute heat to the wafer evenly. Epitaxial layer growth is most uniform when an even temperature is maintained across the entire wafer. Heat loss from the peripheral edge of the wafer is reduced and controlled by a saturn ring 23 disposed circumferentially around the outer edge of the susceptor 22. The saturn ring 23 is comprised of a lower L-shaped ring 26 and an upper L-shaped ring 24 inversely laid on the lower L-shaped ring 26 such that a void 25 is created, wherein thermocouples (not shown) can be distributed to desired locations to monitor and control temperatures. The saturn ring 23 is supported by saturn ring posts 27.

Preferably, the present invention is performed using a wafer containing as little metallic impurities as possible, and more preferably below the detection limit of metals. If the wafer used is above the detection limit for metallic impurities, its level of metallic impurities must be known before epitaxial simulation, and will be used to compare before simulation and after simulation impurity levels.

As shown in FIG. 2a, after epitaxial simulation, the wafer 20 contains a protective layer 47 on the wafer front side 46. The wafer 20 now contains metallic impurities 50 that have migrated from the susceptor (not shown) to the wafer 20, and diffused into the body of wafer 20. In FIG. 2b, the wafer 20 is then subjected to the formation of a gettering layer 60 on the wafer backside 44 and optionally on the protective layer 47, forming layer 62. In the case where layer 62 is formed, it should be noted, however, that it performs no gettering interaction with the wafer 20, or impurities 50 found therein. A typical manner for forming such a gettering layer is by low pressure chemical vapor deposition (LPCVD) of polycrystalline silicon.

To ensure the diffusion of impurities 50 within the wafer 20 into the gettering layer 60, the wafer 20 may then be heated or annealed, as shown in FIG. 2c. For example, the wafer 20 may be annealed in the range of 600° C. to 900° C. for one hour, followed by a slow cool down to approximately 400° to 500° C. The slow cool down allows sufficient time for the impurities 50 to diffuse to the gettering layer 60. Upon completion of the annealing process, the impurities 50 have migrated from the wafer 20 into the gettering layer 60.

The gettering layer 60 can then be analyzed by techniques such as Total Reflection X-Ray Flourescense (TXRF) and/or Secondary Ion Mass Spectroscopy (SIMS) using the techniques outlined in co-pending application Ser. No. 09/544,197.

As noted earlier, the process of the present invention can be used either by stripping the protective layer 47 from the wafer front side surface 46 before forming the gettering layers 60 and 62, or by forming gettering layer 62 directly on the protective layer 47. It is preferable to leave the protective layer 47 on the front side surface 46, however. If the protective layer 47 remains on the front side surface 46, all impurities 50 will migrate to the back side gettering layer 60, whereas if the protective layer 47 is removed, impurities 50 can migrate to both gettering layers 60 and 62. Theoretically, there will be equal amounts of impurities 50 gettered into each gettering layer 60 and 62. In this case, the amount of impurities 50 detected by the analyzing techniques will be half the amount of the impurities 50 in the wafer 20. When the impurity level is very low, the detection limit becomes an important factor, and a measurement result may be below the detection limit when both gettering layers 60 and 62 are used. On the other hand, an accurate measurement may be attainable if only gettering layer 60 is used. In this instance, all gettering will take place in layer 60, thus providing the most concentrated level of impurities 50 and therefore the best opportunity for reaching the detection limit. After measuring the concentration of the localized impurities $N_L$ found in the gettering layer using TXRF methods or the like, the concentration of bulk impurities $N_B$ originally found in the substrate wafer can be found from:

$$N_B = \frac{N_L * T_{layer}}{T_{substrate}}$$

Wherein $T_{substrate}$ is the thickness of the substrate wafer and $T_{laer}$ is the thickness of the gettering layer, considering substantially all impurities are drawn into the gettering layer. Pre-process bulk impurity levels can then be compared to bulk impurities measured after processing the wafer on the epitaxial susceptor, and appropriate actions taken from the information gathered.

An exemplary method for evaluating the impurity concentrations in an epitaxial susceptor is indicated generally in FIG. 3. The method includes, at 210, determining the "pre-process" bulk concentration of impurities in one or more semiconductor substrates. This may be performed by any suitable process, including the method described in co-pending application Ser. No. 09/544,197, TXRF, or SIMS, etc. Alternatively, this step may be omitted and the pre-process bulk impurity concentration may be presumed to be at a particular concentration. The one or more substrates are then processed through the semiconductor process, including a protective layer such as an oxide layer on one wafer surface and leaving bare silicon substrate on the other surface, as indicated at 220.

A substrate wafer is then placed on the epitaxial susceptor using standard handling procedures and methods associated with the type of epitaxial reactor being monitored. The substrate wafer is placed on the susceptor such that the bare silicon substrate surface is facing toward, and in contact with the susceptor, and the surface containing the protective layer is facing away from the susceptor, as shown at 230. The substrate wafer is then processed through an epitaxial deposition cycle representative of the thermal cycle used during standard deposition for that particular epitaxial reactor and process used during normal operating procedures, as shown in 240. It is preferred that gas flows used in epitaxial deposition are incorportated into step 240, to more closely simulate standard processing, but gas flows and constituents may be changed if so desired. Multiple substrate wafers can be singularly processed sequentially through steps 230 and 240 if desired, to obtain a statistically valid sampling in accordance with known statistical process control techniques.

The substrate wafer(s) can optionally have the protective layer stripped, as demonstrated in 250. More preferably, however, the protective layer would not be stripped from the substrate wafer, thereby prohibiting impurities from migrating through the protective layer, and thereby increasing the sensitivity to impurity concentration measurements, as previously explained.

As indicated in 260, a gettering layer is then formed on the substrate wafer using any standard technique, such as deposition of a polycrystalline silicon layer by LPCVD. If the protective layer is stripped as indicated in 250, the gettering layer must be formed on both sides of the substrate wafer. Alternatively, if the protective layer is not stripped, the gettering layer must only be formed on the bare substrate silicon layer, and may be optionally formed on the protective layer, as dictated by cost and ease of manufacture. It should be noted that no inherent benefit will be gained by forming a gettering layer on the protective layer. The substrate wafer(s) is then annealed to promote gettering of the impurities into the gettering layer, as indicated in 270. The impurity concentration in the gettering layer is then measured by suitable means, as indicated at 280. Based on the impurity concentration in the gettering layer, the "post-process" bulk impurity concentration may be calculated using the equation presented above, as indicated in 290.

Finally, the concentration of impurities caused by the epitaxial susceptor is calculated based on the pre-process and post-process impurity concentrations, as indicated in 300. Where substantially all of the impurities were gettered into the gettering layer, the concentration of impurities caused by the epitaxial susceptor may be calculated by subtracting the post-process impurity concentration from the pre-process impurity concentration. Appropriate decisions about the continued use of the susceptor may then be made.

Other embodiments of the present invention will be apparent to those skilled in the art from a consideration of this specification or practice of the invention disclosed herein. It is intended that the specification be considered in all aspects as illustrative, and not restrictive. The scope of the invention is, therefore, indicated by the appended claims rather than by the forgoing description. All changes which come within the meaning and range of the equivalence of the claims are to be embraced within their scope.

What is claimed is:

1. A method of evaluating the concentration of impurities in an epitaxial susceptor, the method comprising:

measuring the concentration of the impurities of a substrate wafer;

forming a protective layer on one surface of the substrate wafer while leaving the other side of the substrate wafer without a protective layer;

placing the substrate wafer on an epitaxial susceptor such that the side of the substrate wafer with the protective layer is away from the susceptor;

heating the substrate wafer while on the epitaxial susceptor;

forming a gettering layer on at least one surface of the substrate wafer;

drawing together a least a portion of the impurities to the gettering layer; and measuring the concentration of the impurities that were drawn together.

2. The method of claim 1, wherein the heating is a simulation of the thermal cycle of an epitaxial deposition process.

3. The method of claim 1, further comprising using the results of the measuring the impurities that were drawn together to determine at least a range of concentrations of impurities that were drawn into the substrate wafer during the heating.

4. The method of claim 1, wherein the gettering layer is a polysilicon layer.

5. The method of claim 1, wherein the impurities include at least one of copper and nickel.

* * * * *